(12) United States Patent
Horng et al.

(10) Patent No.: US 8,895,332 B2
(45) Date of Patent: Nov. 25, 2014

(54) LIGHT-EMITTING DIODE CHIP WITH HIGH LIGHT EXTRACTION AND METHOD FOR MANUFACTURING THE SAME

(75) Inventors: Ray-Hua Horng, Taichung (TW); Dong-Sing Wuu, Taichung (TW); Shao-Hua Huang, Taoyuan County (TW); Chuang-Yu Hsieh, Taipei County (TW); Chao-Kun Lin, San Jose, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/701,336

(22) Filed: Feb. 5, 2010

(65) Prior Publication Data

US 2010/0136728 A1 Jun. 3, 2010

Related U.S. Application Data

(62) Division of application No. 12/039,563, filed on Feb. 28, 2008, now abandoned.

(30) Foreign Application Priority Data

Sep. 21, 2007 (TW) .............................. 96135297 A

(51) Int. Cl.
*H01L 21/00* (2006.01)
*H01L 33/00* (2010.01)
*H01L 33/22* (2010.01)
*H01L 33/44* (2010.01)

(52) U.S. Cl.
CPC ................. *H01L 33/22* (2013.01); *H01L 33/44* (2013.01); *H01L 33/0079* (2013.01)
USPC .............................................. 438/29; 438/26

(58) Field of Classification Search
USPC .......................... 438/22, 26, 29; 257/E33.067
See application file for complete search history.

(56) References Cited

U.S. PATENT DOCUMENTS

| 4,970,430 A | 11/1990 | Kamogawa et al. |
| 6,759,685 B2 | 7/2004 | Horng et al. |
| 6,784,462 B2 | 8/2004 | Schubert |
| 7,285,800 B2 * | 10/2007 | Lai et al. .......................... 257/81 |
| 2003/0032209 A1 | 2/2003 | Yeh et al. |
| 2005/0116309 A1 | 6/2005 | Ohyama et al. |

(Continued)

OTHER PUBLICATIONS

U.S. Appl. No. 12/039,563, filed Feb. 28, 2008, Ray-Hua Horng.

(Continued)

*Primary Examiner* — Laura Menz
*Assistant Examiner* — Candice Y Chan
(74) *Attorney, Agent, or Firm* — Hogan Lovells US LLP

(57) ABSTRACT

This invention provides a light-emitting diode chip with high light extraction, which includes a substrate, an epitaxial-layer structure for generating light by electric-optical effect, a transparent reflective layer sandwiched between the substrate and the epitaxial-layer structure, and a pair of electrodes for providing power supply to the epitaxial-layer structure. A bottom surface and top surface of the epitaxial-layer structure are roughened to have a roughness not less than 100 nm root mean square (rms). The light generated by the epitaxial-layer structure is hence effectively extracted out. A transparent reflective layer not more than 5 μm rms is formed as an interface between the substrate and the epitaxial-layer structure. The light toward the substrate is more effectively reflected upward. The light extraction and brightness are thus enhanced. Methods for manufacturing the light-emitting diode chip of the present invention are also provided.

14 Claims, 8 Drawing Sheets

(56) References Cited

U.S. PATENT DOCUMENTS

| | | |
|---|---|---|
| 2005/0285127 A1 | 12/2005 | Noto et al. |
| 2006/0091409 A1 | 5/2006 | Epler et al. |
| 2006/0237735 A1 | 10/2006 | Naulin et al. |
| 2007/0004066 A1 | 1/2007 | Wuu et al. |
| 2007/0166851 A1 | 7/2007 | Tran et al. |
| 2007/0272930 A1 | 11/2007 | Tseng et al. |

OTHER PUBLICATIONS

U.S. Appl. No. 12/047,165, filed Mar. 12, 2008, Ray-Hua Horng.

PCT Search Report with Written Opinion, PCT/US08/76727, Nov. 19, 2008.

Wei Chih Peng & Yewchung Sermon Wu, Performance of InGaN-Gan LEDs Fabricated Using Glue Bonding on 50-mm Si Substrate, IEEE, pp. 1041-1135, 2006.

Wei Chih Peng & Yewchung Sermon Wu, Enhanced Light Output in Double Roughened GaN Light-Emitting Diodes Via Various Texturing Treatments of Undoped-GaN Layer, Japanese Journal of Applied Physics, vol. 45, No. 10A, 2006, pp. 7709-7712.

Chinese Office Action issued Aug. 12, 2011 with English translation.

Taiwanese Office Action corresponding to Application No. 096135297, issued Jun. 20, 2013.

Yew Chung Sermon Wu et al., "Effect of the Silver Mirror Location on the Luminance Intensity of Double-Roughened GaN Light-Emitting Diodes," Electrochemical and Solid-State, vol. 10, pp. J126-J128, (2007).

Jong Kyu Kim et al., "Omni-Directional Reflectors for Light-Emitting Diodes," Proc. of SPIE, vol. 6134, pp. 61340D-1-61340D-12, (2006).

* cited by examiner

LIGHT-EMITTING DIODE CHIP WITH HIGH LIGHT EXTRACTION AND METHOD FOR MANUFACTURING THE SAME

RELATED APPLICATION

This application is a Divisional patent application of patent application Ser. No. 12/039,563, filed on Feb. 28, 2008, which claims priority, under 35 USC §119, from Taiwan Patent Application No. 96135296 filed on Sep. 21, 2007, the contents of which are incorporated herein by reference in its entirety.

BACKGROUND OF THE INVENTION

1. Field of the Invention

The present invention relates to a chip; and more particularly to a light-emitting diode chip with high light extraction efficiency.

2. Description of the Related Art

Please refer to FIG. 1, which shows a conventional light-emitting diode chip 1. FIG. 1 includes a substrate 11, an epitaxial-layer structure 12 on the substrate 11 and an electrode unit 13 constituted of an N-type electrode 131 and a P-type electrode 132.

As an example, the epitaxial-layer structure 12 is formed of GaN-based material and has an N-type first cladding layer 121, an active layer 122 formed on the first cladding layer 121 and a P-type second cladding layer 123. The first cladding layer 121 and the second cladding layer 123 is opposite to each other and form a carrier injector relative to the active layer 122. As such, when power supply is provided to the epitaxial-layer structure 12, electrons and holes would be recombined in the active layer 122, and then release energy in a form of light.

The N-type electrode 131 and P-type electrode 132, for example, are formed of Au, Ni, Pt, Ag, Al, etc. and/or their alloy. The N-type electrode 131 is disposed on and forms ohmic contact with the first cladding layer 121 of the epitaxial-layer structure 12. The P-type electrode 132 is disposed on and forms ohmic contact with the second cladding layer 123 such that the N-type electrode 131 and P-type electrode 132 provide electric power to the epitaxial-layer structure 12.

When electric energy is supplied to the N-type electrode 131 and P-type electrode 132, current spreads and flows through the epitaxial-layer structure 12, and electrons and holes are injected into the active layer 122, recombining with each other and then releasing energy in the form of light.

The refractive index of the GaN-based material is about 2.6, and the refractive index of its surrounding material, which generally is air, is 1, or the surrounding is a transparent encapsulating material used for packaging and having a refractive index of 1.4. The top surface 124 of the second cladding layer 123 of the epitaxial-layer structure 12 of the light-emitting diode chip 1 is a flat surface. Partial light generated from the epitaxial-layer structure 12, due to their propagation direction, would follow Snell's law and would not escape the epitaxial-layer structure 12. As a consequence, the light extraction of the light-emitting diode chip 1 is not good.

Please refer to FIG. 2, there is much literature and patents that propose to roughen the top surface 124' of the light-emitting diode chip 1' to make the light impinging on the rough top surface 124' have various possible incident angles relative to the rough top surface 124'. The possibility of light escaping the epitaxial-layer structure 12' is thus increased, and the light extraction efficiency is improved.

Nevertheless, the light generated from the epitaxial-layer structure 12' does not entirely propagate toward the top surface 124'. The light propagating toward the substrate 11' faces similar situation as that at the top surface and cannot escape the epitaxial layer 12' to enter the surrounding. Thus, the light extraction is still low.

Some literature proposes to form a reflective mirror layer, which is connected to the epitaxial-layer structure 12', capable of reflecting light. Hopefully, the light propagating toward the substrate 11' can be reflected toward the top surface 124' to improve the possibility of light generated from the epitaxtial-layer structure 12' to escape the epitaxial structure and enter the surrounding. However, the light propagating toward the substrate 11' would be confined in the epitaxial-layer structure 12' due to their propagation directions and cause total internal reflection within the epitaxial-layer structure 12'. Furthermore, the light can be absorbed by the active layer. The reflective mirror layer on the substrate 11' cannot substantially improve the light extraction of the light-emitting diode chip.

It is intended to improve the structure of the light-emitting diode chips 1, 1' to increase the light extraction and brightness.

SUMMARY OF THE INVENTION

A light-emitting diode chip includes a substrate, a transparent refractive layer with a predetermined thickness and a refractive index greater than that of the air but less than that of the epitaxial-layer structure, an epitaxial-layer structure and an electrode unit.

The electrons and holes recombine and then release energy in the form of light emission. The epitaxial-layer structure has a bottom surface connecting to the transparent refractive layer and a top surface opposite to the bottom surface. The bottom surface and top surface are roughened to have a roughness not less than 100 nm root mean square (rms).

The electrode unit has a pair of electrodes separately disposed on the epitaxial-layer structure and forming ohmic contact with the epitaxial-layer structure to provide electric current to the electrodes.

A method for manufacturing a light-emitting diode chip with high light extraction of the present invention includes steps of forming an epitaxial-layer structure, performing a first roughening step, forming a pair of electrodes, forming a provisional substrate, performing a second roughening step, forming a substrate, and removing the provisional substrate.

The step of forming the epitaxial-layer structure includes forming a GaN-based epitaxial-layer structure having an N-type first cladding layer, an active layer and a P-type second cladding layer on a substrate.

The first roughening step is to roughen a top surface of the second cladding layer of the epitaxial-layer structure to have a roughness not less than 100 nm rms.

The step of forming the pair of electrodes includes forming a pair of electrodes separately on the first cladding layer and on the roughened top surface of the second cladding layer, respectively, and forming ohmic contact with them.

The step of forming the provisional substrate is to form the provisional substrate separately on the second cladding layer and remove the substrate under the epitaxial-layer structure to expose the bottom surface of the first cladding layer.

The second roughening step is to roughen a bottom surface of the first cladding layer to have a roughness not less than 100 nm rms.

The step of forming the substrate is to attach the substrate onto the bottom surface of the first cladding layer with glue having a predetermined refractive index and being transparent to the light generated from the epitaxial-layer structure.

The fabrication of light-emitting diode chip with high light extraction efficiency is completed when the step of removing the provisional substrate is completed.

Another method for manufacturing a light-emitting diode chip with high light extraction efficiency includes steps of forming an epitaxial-layer structure, performing a first roughening step, forming a pair of electrodes, forming a provisional substrate, performing a second roughening step, forming a transparent refractive layer, forming a substrate, and removing the provisional substrate.

The step of forming the epitaxial-layer structure includes forming a GaN-based epitaxial-layer structure having an N-type first cladding layer, an active layer and a P-type second cladding layer on a substrate.

The first roughening step is to roughen a top surface of the second cladding layer of the epitaxial-layer structure to have a roughness not less than 100 nm.

The step of forming the pair of electrodes includes forming a pair of electrodes separately on the first cladding layer and on the roughened top surface of the second cladding layer, respectively, and forming ohmic contact with them.

The step of forming the provisional substrate is to form the provisional substrate separately on the second cladding layer and remove the substrate under the epitaxial-layer structure to expose the bottom surface of the first cladding layer.

The second roughening step is to roughen a bottom surface of the first cladding layer to have a roughness not less than 100 nm rms.

The step of forming the transparent refractive layer is to form a transparent refractive layer with a refractive index greater than that of the air but less than that of the epitaxial-layer structure and having a thickness not more than 5 μm connecting to the first cladding layer of the epitaxial-layer structure.

The step of forming the substrate is to form a substrate with high thermal conductivity coefficient connecting to the transparent refractive layer.

The step of removing the provisional substrate results in the light-emitting diode chip with high light extraction efficiency.

The present invention provides a manufacturing process to produce a light-emitting diode chip with an epitaxial-layer structure having a top surface and bottom surface with predetermined roughness. The light generated from the epitaxial-layer structure can be effectively extracted out from the diode chip through the roughened top surface and bottom surface of the epitaxial-layer structure. In addition, the transparent refractive layer forms an interface between the epitaxial-layer structure and the substrate, and being capable of effectively reflecting the light propagating toward the substrate back toward the top surface of the diode chip to improve the light extraction efficiency.

DETAILED DESCRIPTION

The light-emitting diode chip with high light extraction efficiency provided by the present invention will be described and explained in detail through the following aspects in conjunction with the accompanying drawings. It should be noted that like elements in the following description are designated in the same numerals.

Figure 1:
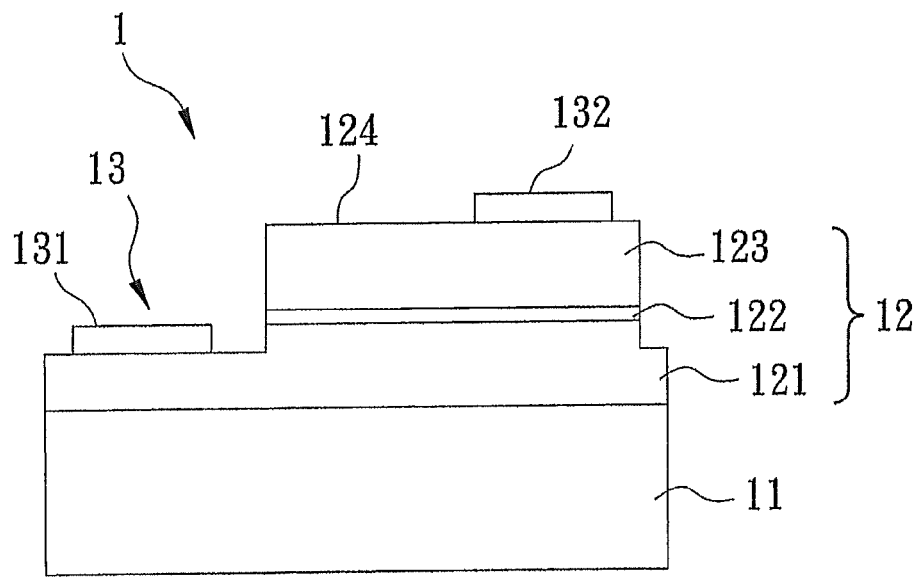
FIG. 1 is a schematic cross-sectional view of a conventional light-emitting diode chip.
Figure 2:
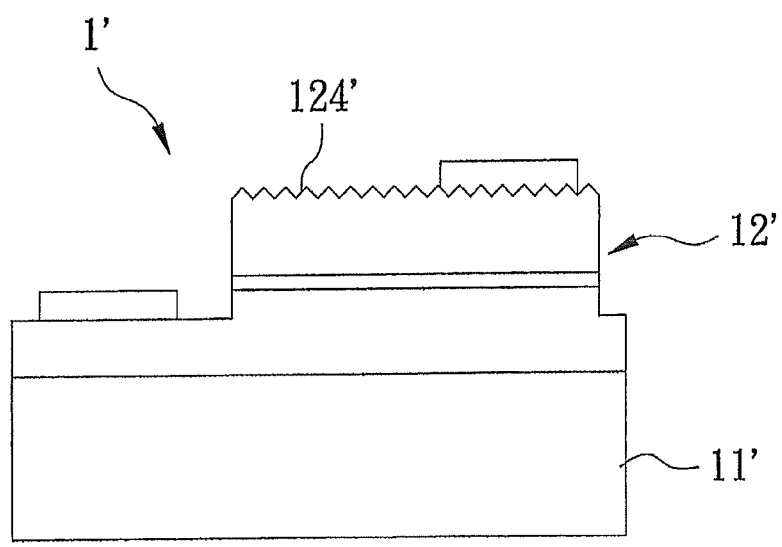
FIG. 2 is a schematic cross-sectional view of another conventional light-emitting diode chip.
Figure 3:
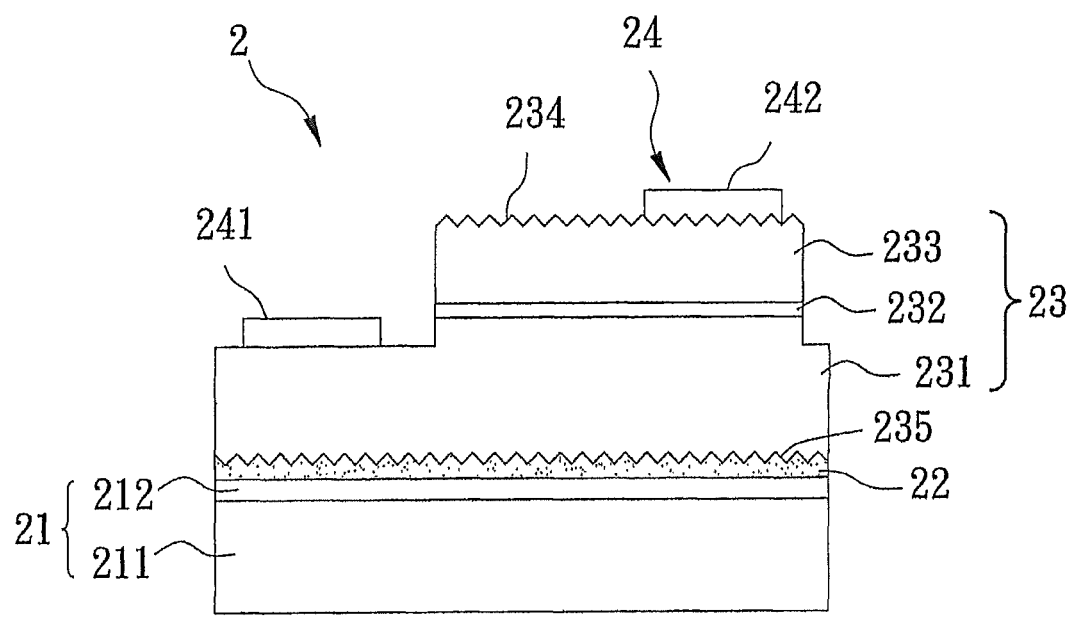
FIG. 3 is a schematic cross-sectional view of a light emitting diode chip in accordance with a first aspect of the present invention.

Please refer to FIG. 3, which shows a cross-sectional view of a light-emitting diode chip in accordance with a first aspect of the present invention. The light-emitting diode chip includes a substrate 21, a transparent refractive layer 22, an epitaxial-layer structure 23 and an electrode unit 24.

The substrate 21 includes a bottom substrate 211 and a reflective mirror layer 212. The reflective mirror layer connects to and is on the bottom substrate 211. The bottom substrate 211 is formed of a material including silicon, highly thermal conductive ceramic or highly thermal conductive metallic material. The bottom substrate 211 is used for supporting the transparent refractive layer 22 and the epitaxial-layer structure 23, etc. The reflective mirror layer 212 can be formed of Al, Ag, Au, Pt, Pd, Rb or a combination thereof. The reflective mirror layer 212 also can be formed of high-refractive index dielectric layers and low-refractive index dielectric layers alternately disposed to each other. The reflective mirror layer 212 is used for reflecting the light generated from the epitaxial-layer structure 23 propagating toward the substrate 21.

The transparent refractive layer 22 has a thickness not more than 5 μm and is a kind of glue formed of polymer or dielectric material, in which the polymer has a high thermal conductivity up to 0.2 W/m·K or more, and having a refractive index between 1 and 2. The transparent refractive layer 22 is use to reflect the light propagating toward the substrate 21 and hence increase the light extraction.

The epitaxial-layer structure 23 is formed of GaN-based material, which includes an N-type first cladding layer 231, an active layer 232 connecting to the N-type first cladding layer 231 and a P-type second cladding layer 233 connecting to the active layer 232 and opposite to the N-type first cladding layer 231. The first cladding layer 231 and second cladding layer 233 form carrier injectors relative to the active layer 232 such that electrons and holes can be recombined and releasing energy in the form of light emission. The bottom surface 235 of the epitaxial-layer structure 23 (i.e. the bottom surface of the first cladding layer 231) and the top surface 234 of the epitaxial-layer structure 23 (i.e. the top surface of the second cladding layer 233) are roughened by either epitaxial growth, wet etching, inductively-coupled plasma etching or Photo-assisted chemical etching to become a discontinuous roughened surface with a roughness not less than 100 nm root mean square (rms). Root mean square means the average between the height deviations and the mean line/surface, taken over the evaluation length/area. The epitaxial-layer structure 23 is attached to the substrate 21 through the transparent refractive layer 22 as a glue therebetween.

The electrode unit 24 includes an N-type electrode 241 and a P-type electrode 242 formed of, for example, Au, Ni, Pt, Ag, Al, etc or their alloy. The N-type electrode 241 is disposed on and in ohmic contact with the first cladding layer 231. The P-type electrode 242 is disposed on and in ohmic contact with the second cladding layer 233. The N-type electrode 241 and P-type electrode 242 provide electric energy to the epitaxial-layer structure 23 and generate light.

When electric energy is applied to the N-type electrode 241 and P-type electrode 242, the current flows through the epitaxial-layer structure 23 such that electrons and holes are recombined in the epitaxial-layer structure 23, and release energy in the form of light emission. The light propagating through the top surface 234 of the epitaxial-layer structure 23 (i.e. the top surface of the second cladding layer 233) would have various incident angles relative to the top surface 234 so as to minimize reflection of the light back to the epitaxial-layer structure 23, and the possibility of light entering the surrounding is significantly increased. Likely, the light generated from the epitaxial-layer structure 23 and propagating toward the bottom surface 235 (i.e. the bottom surface of the first cladding layer 231) would have various incident angles relative to the bottom surface 235 because the bottom surface 235 has a roughness not less than 100 nm rms, and thus increasing the chance of light entering the transparent refractive layer 22. At this time, because the transparent refractive layer 22 has a thickness less than 5 μm and a refractive index between 1 and 2, the transparent refractive layer 22 is a medium between the epitaxial-layer structure 23 and the reflective mirror layer 212 of the substrate 21. The light is reflected in all directions between the interface of the transparent refractive layer 22 and the reflective mirror layer 212, and then passing through the transparent refractive layer 22 and the epitaxial-layer structure 23, entering the surrounding. Thus, the brightness of the present light-emitting diode chip is effectively enhanced.

For the light-emitting diode chip with high light extraction efficiency, the electrode unit 24 and the epitaxial-layer structure 23 constitute a current path and the excess heat generated by the epitaxial-layer structure 23 while generating light is effectively dissipated. The heat and current are conducted in different paths. The resistance of the device would not be affected by the path of thermal dissipation. As a result, the operation of the present light-emitting diode chip will be stable with a long lifetime.

The method for manufacturing the light-emitting diode chip 2 of the present invention will be described and explained in details in the following.

Figure 4:
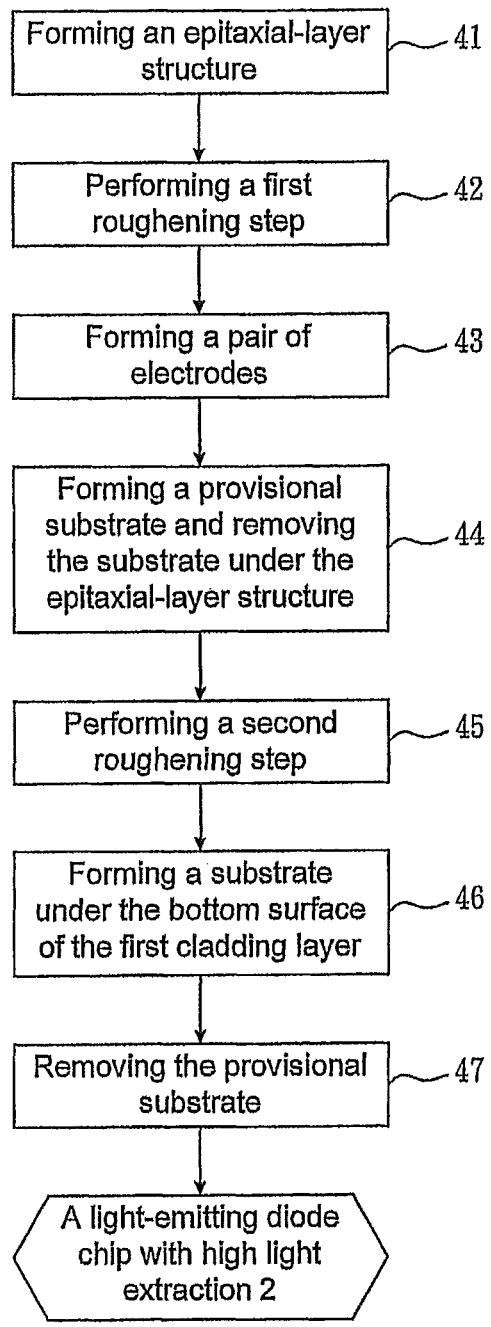
FIG. 4 is a process flow for manufacturing the light emitting diode chip of the first aspect of the present invention.

Please refer to FIG. 4, the method for manufacturing the light-emitting diode chip 2 includes step 41 forming an epitaxial-layer structure, step 42 performing a first roughening step, step 43 forming a pair of electrodes, step 44 forming a provisional substrate and removing the substrate under the epitaxial-layer structure, step 45 performing a second roughening step, step 46 forming a substrate under the bottom surface of the first cladding layer of the epitaxial-layer structure, and step 47 removing the provisional substrate. Thus, a light-emitting diode chip with high light extraction 2 is made.

Figure 5:
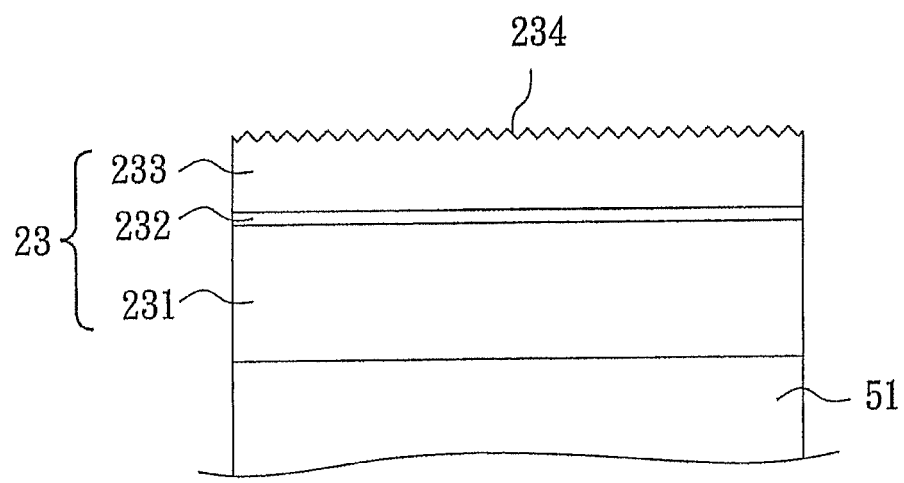
FIGS. 5 through 10 are schematic cross-sectional views corresponding to various stages of the process flow of FIG. 4.

Please refer to FIG. 5, in step 41, forming the epitaxial-layer structure 23 including the first cladding layer 231, the active layer 232 and the second cladding layer 233 on a substrate 51 on which GaN-based semiconductor material can epitaxially grown.

Subsequently, in step 42, the first roughening step is performed by the Inductively-coupled plasma etching method to roughen the surface of the second cladding layer 233 of the epitaxial-layer structure 23 (i.e. the top surface 234 of the epitaxial-layer structure 23) to have a roughness not less than 100 nm rms. In this step, an epitaxial growth method also can be employed to directly grow the roughened top surface 234 of the epitaxial-layer structure 23. The first roughening step also can be performed by wet etching or photo-assisted chemical etching.

Figure 6:
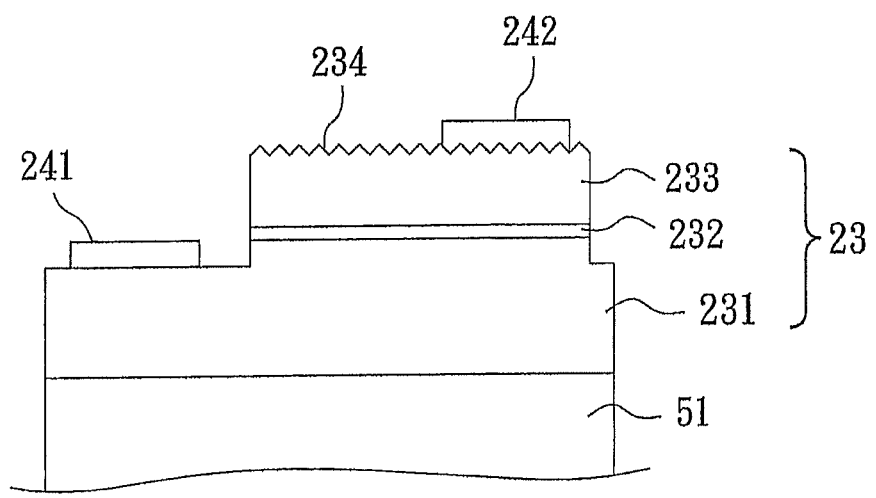

Please refer to FIG. 4 and FIG. 6, performing step 43, a partial portion of the epitaxial-layer structure 23 is removed to form a mesa thereon. Then, the N-type electrode 241 and P-type electrode 242 are respectively formed on and in ohmic contact with the first cladding layer 231 and second cladding layer 233.

Figure 7:
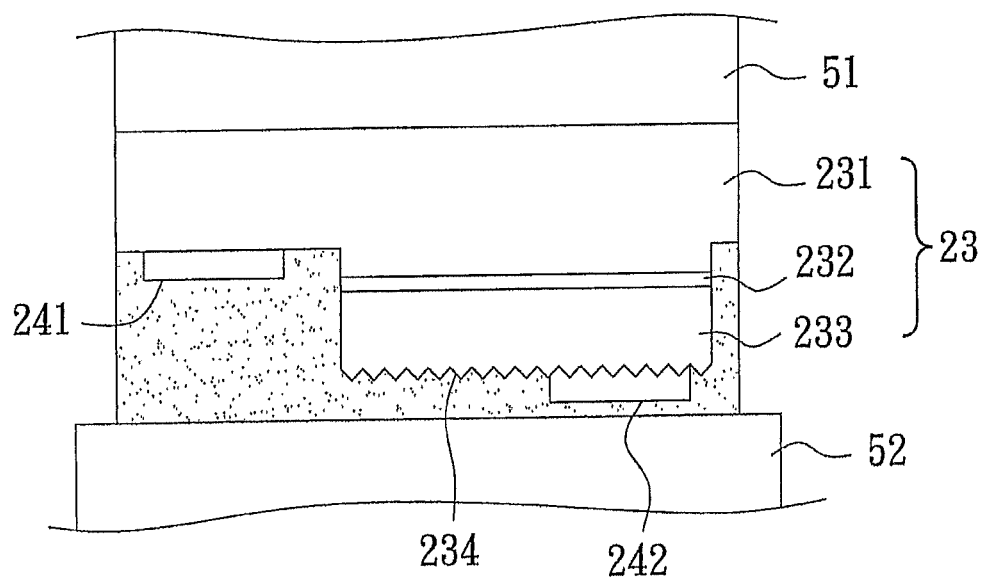
Figure 8:
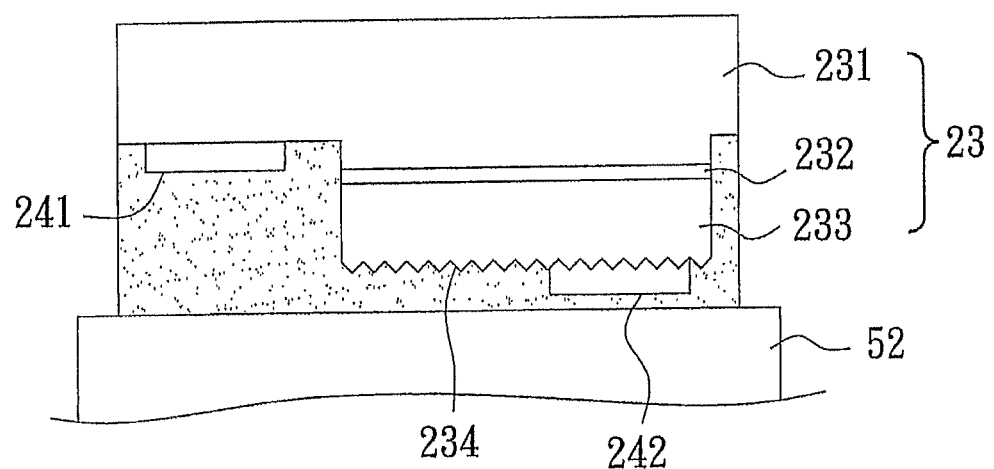

Please refer to FIG. 4, FIG. 7 and FIG. 8. When performing step 44, a provisional substrate 52 is attached separately, under the second cladding layer 233, with wax or removable glue as shown in FIG. 7. Then, the substrate 51 is removed by the laser lift off, etching or smart cut, etc. to expose the bottom surface of the first cladding layer 231 of the epitaxial-layer structure 23, as shown in FIG. 8.

Figure 9:
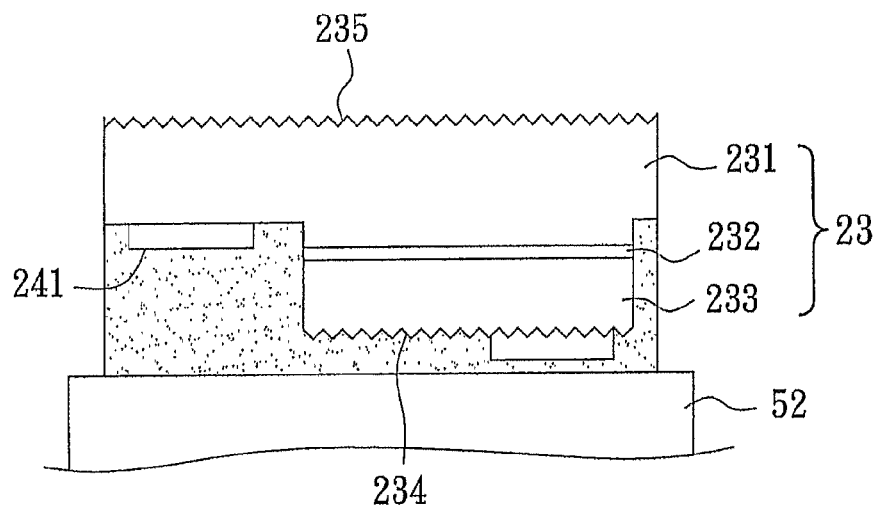

Please refer to FIG. 4 and FIG. 9, in step 45, performing the second roughening step with wet etching to roughen the exposed surface of the first cladding layer 231 to have a roughness not less than 100 nm rms (i.e. forming the bottom surface 235 of the epitaxial-layer structure 23). Likely, the second roughening step can be performed by wet etching or photo-assisted chemical etching.

Figure 10:
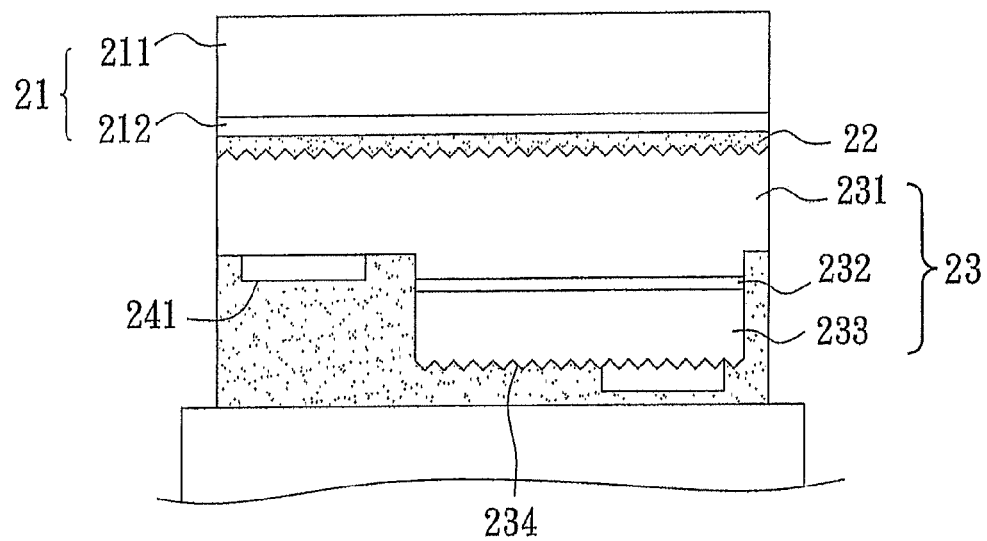

Please refer to FIG. 4 and FIG. 10, performing step 46, attaching the substrate 21 to the roughened surface (i.e. the bottom surface 232 of the first cladding layer 235 with glue having a refractive index and transparent to the light generated from the epitaxial-layer structure 23). The glue is cured to become the transparent refractive layer 22 and its thickness is controlled to be not more than 5 μm so as to obtain the best optical and thermal performance. The reflective mirror layer 212 also can be firstly coated on a bottom silicon substrate 211 to form the substrate 21.

Please refer to FIG. 3 and FIG. 4, finally, in step 47, removing the provisional substrate 52 and cleaning the residue left on the epitaxial-layer structure 23 such as the residue of wax that is used for attaching the provisional substrate 52 onto the epitaxial-layer structure 23. The light-emitting diode chip with high light extraction efficiency 2 is thus obtained.

Figure 12:
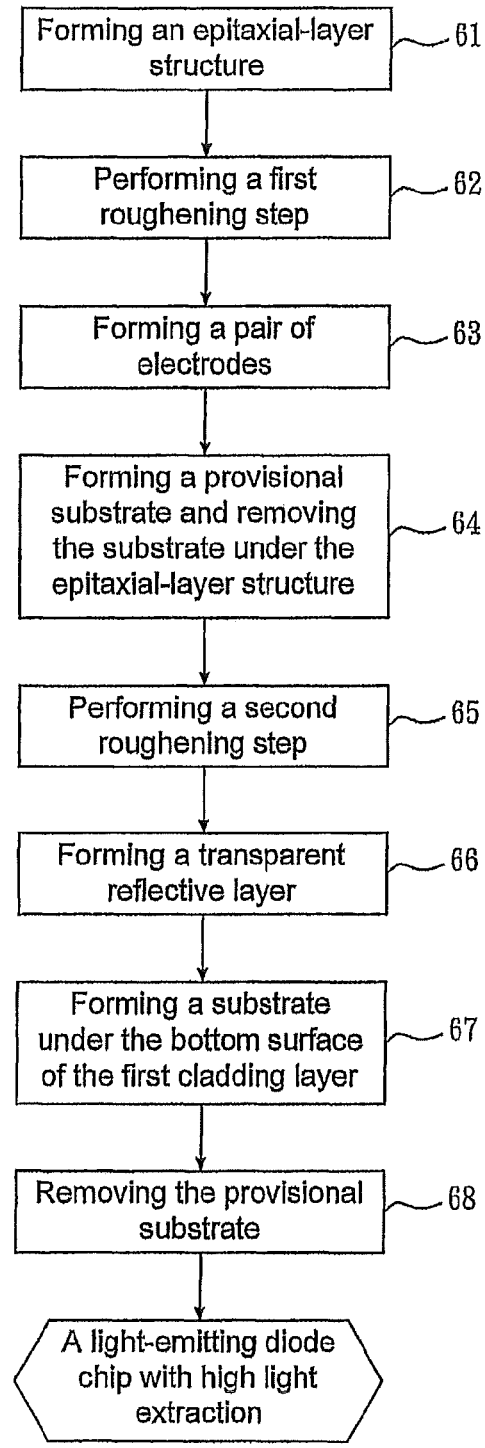
FIG. 12 is a process flow of the light emitting diode chip of the second aspect of the present invention.

In a second aspect of the light-emitting diode chip of the present invention, glue is applied onto a cross-sectional U-shaped substrate 21 and then the epitaxial-layer structure 23 is attached to the cross-sectional U-shaped substrate 21 with the glue. The glue is cured to become the transparent refractive layer 22. Additionally, the light-emitting diode chip with high light extraction of the second aspect can be manufactured in accordance with the process flow of FIG. 12. In step 61, the epitaxial-layer structure 23 is formed on an epitaxial substrate. In step 62, the surface of the second cladding layer 233 of the epitaxial-layer structure 23 is roughened to have a roughness not less than 100 nm rms. A mesa portion is formed on the epitaxial-layer structure 23. Then, the N-type electrode 241 and P-type electrode 242 are separately formed on the epitaxial-layer structure 23. A provisional substrate is attached onto the roughened top surface 234 of the epitaxial-layer structure 23. Then, the epitaxial substrate is separated from the epitaxial-layer structure 23. Thereafter, the surface of the first cladding layer 231 is roughened by wet etching to have a roughness not less than 100 nm rms. A partial finished light-emitting diode chip is shown in FIG. 9.

Subsequently, in step 66, the transparent refractive layer 22 transparent to the light generated by the epitaxial-layer structure 23 and having a refractive index between the air and the epitaxial-layer structure is deposited on the bottom surface of the epitaxial-layer structure 23. The transparent refractive layer 22 has a thickness not more than 5 μm rms.

Figure 11:
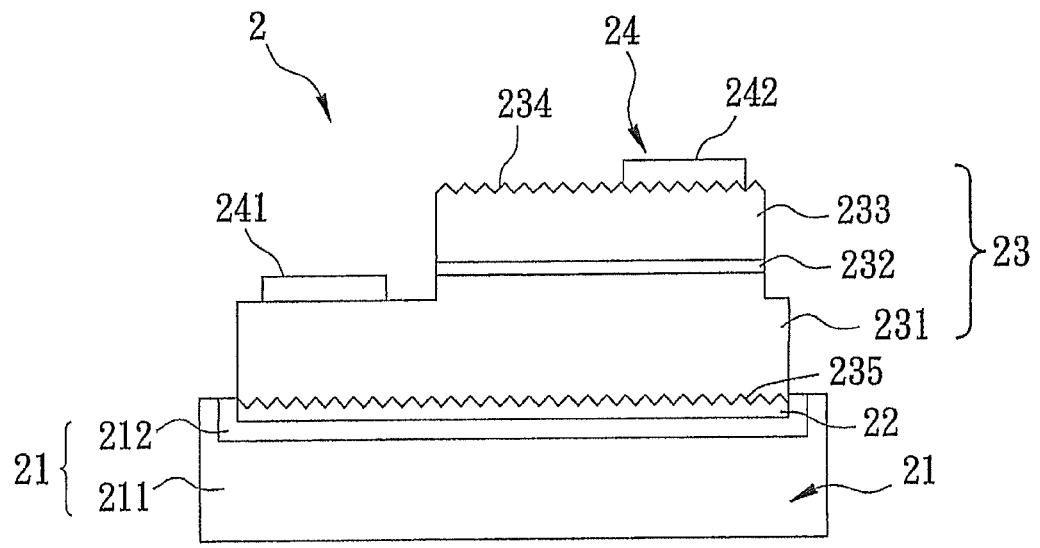
FIG. 11 is a schematic cross-sectional view of a light emitting diode chip in accordance with a second aspect of the present invention.

Then, in step 67, a seed layer is deposited on the transparent refractive layer 22. Then, an electrical plating process is performed to form the substrate 21 from the seed layer. When the seed layer is only deposited on the bottom surface of the transparent refractive layer 22, the substrate 21 is formed as shown in FIG. 3. When the seed layer is deposited on the side-wall and the bottom surface of the transparent refractive layer 22, the substrate 21 is formed as a cup holding the chip as shown in FIG. 11. Moreover, the substrate 21 can comprise a bottom substrate 211 and a reflective mirror layer 212, in which a seed layer formed of predetermined material is formed. Then, the seed layer is thickened to form the reflective mirror layer 212. The bottom substrate 211 is formed under the reflective mirror layer 212. The manufacturing process for forming the substrate 21 comprising the bottom substrate 211 and the reflective mirror layer 212 is well known and would not be described again herein.

Finally, in step 68, the provisional substrate is removed. The residue left on the epitaxial-layer structure 23 such as the residue of wax that is used for attaching the provisional substrate to the epitaxial-layer structure 23 is cleaned. The light-emitting diode chip with high light extraction efficiency is thus obtained.

Figure 13:
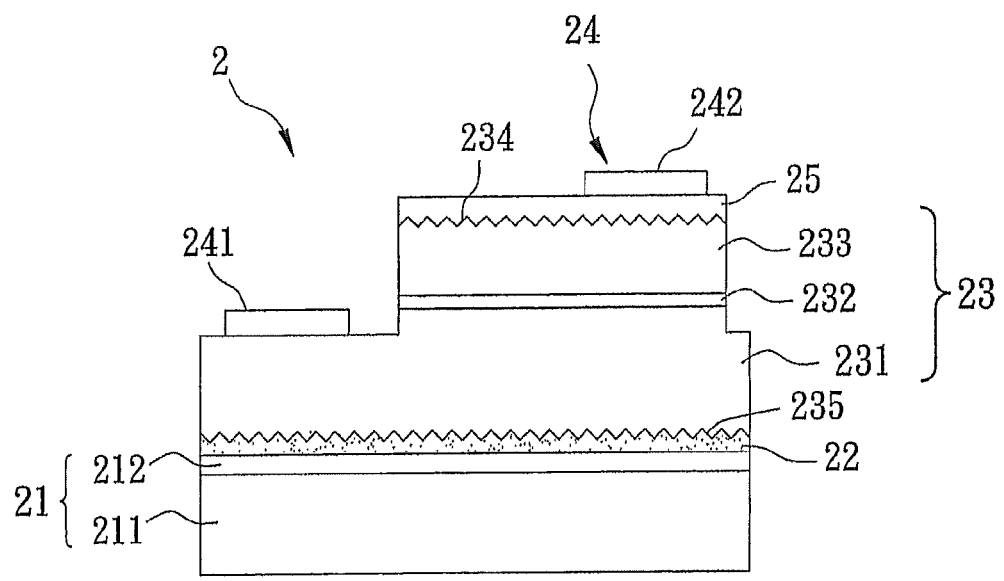
FIG. 13 is a schematic cross-sectional view of a light-emitting diode chip in accordance with a third aspect of the present invention.

FIG. 13 is a schematic cross-sectional view of the light-emitting diode chip in accordance with a third aspect of the present invention. The difference between the third aspect and the above two aspects is a transparent electrical conductive layer 25 capable of uniformly spreading the current is formed on the top surface 234 of the epitaxial-layer structure 23 to improve the external quantum efficiency of the diode chip. The surface of the transparent electrical conductive layer 25 can be flat or roughened to substantially increase the light extraction out of the diode chip.

The difference between the process for manufacturing the light-emitting diode chip of the third aspect and the above two processes is after performing the first roughening step 42, 62 but before the formation of the pair of the electrodes in step 43, 63, the transparent electrical conductive layer of Indium Tin Oxide (ITO) 25 is deposited on the roughened top surface 234 of the epitaxial-layer structure 23. The transparent electrical conductive layer of Indium Tin Oxide (ITO) 25 can also be roughened by the above methods.

The light-emitting diode chip employs the roughened top surface 234 and bottom surface 235 of the epitaxial-layer structure 23 to improve the light extraction from the diode chip. The transparent refractive layer 22 with the predetermined thickness as an interface between the epitaxial-layer structure 23 and the substrate 21 can more effectively reflect the light propagating toward the substrate 21 back toward the top surface 234 to further improve the light extraction. The brightness of the diode chip is enhanced. Compared to the conventional light-emitting diode chip 1, 1' in which the light propagating toward the substrate 11, 11' can not be extracted out of the diode chip and wasted, the present light-emitting diode chip and its manufacturing methods actually can improve the light extraction.

The examples given above serve as the aspects of the present invention only. The examples should not be construed as a limitation on the actual applicable scope of the invention, and as such, all modifications and alterations without departing from the spirits of the invention and appended claims, including other aspects, shall remain within the protected scope and claims of the invention.

What is claimed is:

1. A method for manufacturing a light-emitting device, comprising:
    forming an epitaxial-layer structure for generating light by electro-optical effect on a first substrate, said epitaxial-layer structure having a first layer of first conductivity, a second layer of second conductivity and an active layer sandwiched between said first layer and said second layer;
    performing a first roughening step for roughening a top surface of said second layer;
    forming a pair of electrodes respectively in electrical contact with said first layer and said second layer;
    forming a provisional substrate separately on said second layer and removing said first substrate under said epitaxial-layer structure to expose a bottom surface of said first layer;
    performing a second roughening step for roughening the bottom surface of said first layer;
    forming a transparent refractive layer connecting to said first layer, said transparent refractive layer having a refractive index greater than that of the air and less than that of the epitaxial-layer structure;
    forming a second substrate including a mirror reflective layer connecting to said transparent refractive layer; and
    removing said provisional substrate,
    wherein the step of forming the second substrate comprises forming a seed layer on side and bottom surfaces of said transparent refractive layer and then performing an electroplating process to form the second substrate from said seed layer so that the reflective mirror layer has a U-shape surrounding said side and bottom surfaces of said transparent refractive layer.

2. The method for manufacturing a light-emitting device as claimed in claim 1, further comprising forming a transparent electrical conductive layer on a top surface of said second layer.

3. The method for manufacturing a light-emitting device as claimed in claim 2, further comprising roughening a top surface of said transparent electrical conductive layer.

4. The method for manufacturing a light-emitting device as claimed in claim 1, wherein said first roughening step and said second roughening step are performed by epitaxial growth, wet etching, inductively-coupled plasma etching or photo-assisted chemical etching.

5. The method for manufacturing a light-emitting device as claimed in claim 1, wherein said provisional substrate is attached on said second layer with wax or removable glue.

6. The method for manufacturing a light-emitting device as claimed in claim 1, wherein said first substrate is removed by chemical etching, laser lift-off or smart cut.

7. The method for manufacturing a light-emitting device as claimed in claim 1, wherein the transparent refractive layer is formed by film deposition.

8. The method for manufacturing a light-emitting device as claimed in claim 1, wherein the step of forming said seed layer with thin-film deposition process.

9. The method for manufacturing a light-emitting device as claimed in claim 1, wherein the reflective mirror layer includes electrical conductive material, electrical insulating material or a combination thereof.

10. The method for manufacturing a light-emitting device as claimed in claim 1, wherein the reflective mirror layer is formed of high-refractive index dielectric layers and low-refractive-index dielectric layers alternately disposed to each other.

11. The method for manufacturing a light-emitting device as claimed in claim 1, wherein said transparent refractive layer has a thickness not more than 5 μm.

12. The method for manufacturing a light-emitting device as claimed in claim 1, wherein said top surface of said second layer is roughened to have a roughness not less than 100 nm.

13. The method for manufacturing a light-emitting device as claimed in claim 1, wherein said bottom surface of said first layer is roughened to have a roughness not less than 100 nm.

14. The method for manufacturing a light emitting device as claimed in claim 1, wherein said pair of electrodes are formed respectively in ohmic contact with said first layer and said second layer.

* * * * *